(12) United States Patent
Vinson et al.

(10) Patent No.: US 10,199,183 B2
(45) Date of Patent: Feb. 5, 2019

(54) VACUUM-INSULATED SWITCH ENABLING TESTING OF THE VACUUM, SWITCH ASSEMBLY, AND TESTING METHOD

(71) Applicant: SUPERGRID INSTITUTE SAS, Villeurbanne (FR)

(72) Inventors: Paul Vinson, Chavagneux (FR); Alain Girodet, Chassieu (FR)

(73) Assignee: SUPERGRID INSTITUTE SAS, Villeurbanne (FR)

( * ) Notice: Subject to any disclaimer, the term of this patent is extended or adjusted under 35 U.S.C. 154(b) by 0 days.

(21) Appl. No.: 15/324,884

(22) PCT Filed: Jul. 9, 2015

(86) PCT No.: PCT/EP2015/065729
§ 371 (c)(1),
(2) Date: Jan. 9, 2017

(87) PCT Pub. No.: WO2016/005509
PCT Pub. Date: Jan. 14, 2016

(65) Prior Publication Data
US 2017/0200572 A1    Jul. 13, 2017

(30) Foreign Application Priority Data

Jul. 10, 2014  (FR) ..................... 14 56672

(51) Int. Cl.
*H01H 11/00* (2006.01)
*H01H 33/668* (2006.01)
(Continued)

(52) U.S. Cl.
CPC ..... *H01H 11/0062* (2013.01); *G01R 31/3274* (2013.01); *H01H 33/66* (2013.01); *H01H 33/668* (2013.01)

(58) Field of Classification Search
CPC ............. H01H 33/668; H01H 11/0062; H01H 2033/6668; H01H 31/003
(Continued)

(56) References Cited

U.S. PATENT DOCUMENTS 4,553,139 A * 11/1985 Tanigaki .............. H01H 33/668
340/626
5,399,973 A * 3/1995 Kitamura ........... G01R 31/3275
324/424
(Continued)

FOREIGN PATENT DOCUMENTS

EP    0 001 763 A1    5/1979
EP    1 343 185 A1    9/2003
(Continued)

OTHER PUBLICATIONS

Translation JPH 11273513 (original doc. published Oct. 8, 1999).*
(Continued)

*Primary Examiner* — Edwin A. Leon
*Assistant Examiner* — William Bolton
(74) *Attorney, Agent, or Firm* — Pearne & Gordon LLP

(57) ABSTRACT

A medium- or high-voltage switch (10), comprising a high-vacuum enclosure (111); first and second contacts (121, 122) that are mounted to be movable in translation relative to each other inside the enclosure (111) between an open position in which the first and second contacts (121, 122) are spaced apart; and a closed position in which the first and second contacts (121, 122) are in electrical contact. The switch (10) further comprises a conductor (210, 220, 230) arranged inside the enclosure (111) in such a manner that there exists a pressure threshold inside the enclosure (111) from which partial discharges are generated by said conductor, at least when the first and second contacts (121, 122) are in the closed position and the medium or high voltage is applied to
(Continued)

the switch (10). The invention further relates to a switch assembly and to a method of testing such a switch.

10 Claims, 3 Drawing Sheets

(51) Int. Cl.
  *H01H 33/66* (2006.01)
  *G01R 31/327* (2006.01)
(58) Field of Classification Search
  USPC .............. 218/118, 122–124, 126, 144–147; 340/626; 324/424
  See application file for complete search history.

(56) References Cited

U.S. PATENT DOCUMENTS

| | | | | |
|---|---|---|---|---|
| 5,739,419 | A | * | 4/1998 | Maier .................. H01H 33/668 73/37 |
| 6,153,846 | A | * | 11/2000 | Morita ................. H01H 33/668 218/122 |
| 2012/0145674 | A1 | | 6/2012 | Schellekens et al. |
| 2014/0190726 | A1 | | 7/2014 | Kieffel et al. |
| 2015/0228375 | A1 | | 8/2015 | Kieffell et al. |
| 2016/0241004 | A1 | | 8/2016 | Kieffel et al. |

FOREIGN PATENT DOCUMENTS

| | | |
|---|---|---|
| EP | 1 763 049 A1 | 3/2007 |
| FR | 2 968 827 A1 | 6/2012 |
| JP | S50-69568 A | 6/1975 |
| JP | S61-136436 U | 8/1986 |
| JP | H11-273513 A | 10/1999 |

OTHER PUBLICATIONS

French Search Report Issued in Patent Application No. FR 1456672 dated Mar. 9, 2015.
International Search Report issued in Patent Application No. PCT/EP2015/065729 dated Oct. 9, 2015.
Written Opinion issued in Patent Application No. PCT/EP2015/065729 dated Oct. 9, 2015.
International Preliminary Report on Patentability issued in issued in Patent Application No. PCT/EP2015/065729 dated Oct. 21, 2016.
U.S. Appl. No. 15/324,439, "Self-Blast Circuit Breaker Using the Two-Phase State of a Gas to Improve the Cut-Off Properties", filed Jan. 6, 2017.

* cited by examiner

VACUUM-INSULATED SWITCH ENABLING TESTING OF THE VACUUM, SWITCH ASSEMBLY, AND TESTING METHOD

TECHNICAL FIELD

The present invention relates to a medium- or high-voltage vacuum-insulated switch such as a vacuum bottle, and in particular a vacuum bottle used as a means for making or breaking a circuit in equipment such as an electric circuit breaker.

When there is a loss of vacuum in a vacuum bottle, the dielectric strength between the various live elements is reduced. Correct operation of the means for making or breaking a circuit is then compromised. Vacuum bottles are devices that perform well providing the pressure inside the vacuum bottle is maintained below a critical pressure threshold of the order of 0.1 pascal (Pa), i.e. 0.001 millibars (mbar). If the pressure inside the vacuum bottle crosses such a pressure threshold, its performance is diminished and it may even be rendered inoperative, or even explode.

STATE OF THE PRIOR ART

In order to check that the pressure inside the vacuum bottle is maintained below the critical pressure threshold, it is possible, for example, to bring the electrical contacts that are present in said circuit breaker closer together, and then to test the dielectric strength at a low voltage applied at the electrical contacts. If the dielectric strength is not satisfactory, it may be assumed that the pressure inside the enclosure is greater than the critical pressure. Nevertheless, there may be multiple causes of such a reduction in dielectric strength and in particular causes associated with electrical wear of the contacts, which is a normal phenomenon. It therefore cannot be decided solely on the basis of such a test that the pressure inside the vacuum bottle has reached the critical pressure threshold.

French patent No. FR 2 968 827 A1 presents a vacuum bottle that makes it possible to test a vacuum. Implementing such a device is relatively complex, since it requires resorting to injection molding, which can pose problems of reliability and reduce the capacity of the system to pass current as a result of subsequent heating problems. It is also necessary to place a conductive material on the vacuum bottle casing, and that requires increasing insulation distances in order to withstand the voltage outside the vacuum bottle.

That device uses a voltage divider having capacitance that varies as a function of the loss of vacuum. It appears that simply opening or closing the contacts inside the vacuum bottle causes said capacitance to vary.

Furthermore, that device requires information to be output via a wired connection to a screen that is outside the vacuum bottle, in order to enable the detected current to be read. For reasons of insulation, that is complicated to put into practice for a medium- or high-voltage vacuum bottle.

In order to test for the loss of vacuum in the vacuum bottle, the circuit breaker must be taken out of operation. Furthermore, a prior opening operation is thus required. When the circuit breaker is on load, if its vacuum has been lost, such an opening operation may lead to non-interruption of the current and possibly to destruction of the vacuum bottle.

SUMMARY OF THE INVENTION

An object of the invention is to solve these above-mentioned drawbacks, at least in part.

Thus, the invention aims to provide a medium- or high-voltage vacuum-insulated switch that does not require the switch to pass into the open position in order to test the pressure that exists within the switch enclosure.

The invention also aims to provide a medium- or high-voltage vacuum-insulated switch that is simpler to manufacture than a prior art switch.

The invention provides a medium-voltage or high-voltage switch, comprising:
  a high-vacuum enclosure; and
  first and second contacts that are mounted to be movable in translation relative to each other inside the enclosure between an open position in which the first and second contacts are spaced apart, and a closed position in which the first and second contacts are in electrical contact.

The switch further comprises a conductor arranged inside the enclosure in such a manner that there exists a pressure threshold inside the enclosure from which partial discharges are generated by said conductor, at least when the first and second contacts are in the closed position and the medium or high voltage is applied to said switch.

With such an arrangement of a conductor inside the enclosure, merely detecting discharges makes it possible to determine that the pressure inside the enclosure is greater than the pressure threshold. Unlike the method of the prior art, this detection does not require the switch to be placed in the open position. Thus, any risk of the switch exploding during such passage from the closed position to the open position is avoided.

In addition, the use of a conductor positioned inside the enclosure to implement a vacuum test does not require a potential to be applied to said conductor, and partial discharges may be detected outside the enclosure. Therefore, unlike prior art switches, such a switch does not present any need to output information via a wired connection or to apply a voltage via the same channel. As a result, such a switch does not present the manufacturing complications of a prior art switch, while allowing a vacuum inside the enclosure to be tested.

Above, and in the remainder of the document, the term "high vacuum" refers to pressure lying in the range $10^{-3}$ Pa to $10^{-5}$ Pa.

Above, and in the remainder of the document, the term "medium and high voltage" refers to an alternating current (AC) voltage lying in the range 1 kilovolts (kV) to 50 kV, and greater than 50 kV respectively.

Above, and in the remainder of the document, the term "partial discharges generated by the conductor" refers to the fact that the conductor is arranged so that its configuration enables partial discharges to be generated between the conductor and a portion of the switch, said switch portion being suitable for being subjected to high voltage or for being connected to ground.

A partial discharge corresponds to the appearance of an electric arc between two portions of the switch between which there exists a significant potential difference, said arc corresponding to a transfer of load between two portions of the switch. Such a discharge presents an electromagnetic signature having its frequency lying in the range 100 megahertz MHz to at least 3 gigahertz (GHz), i.e. in the ultra high frequency range. The electromagnetic wave, which is a signature of said partial discharge, may be detected by means of an ultra high frequency antenna.

Above, and in the remainder of the document, the term "floating potential" refers to the fact that a portion of the switch made from a conductive material, such as a conductor or the shield, is not physically connected to any reference potential, whether this reference is fixed (e.g. ground) or variable (e.g. an AC voltage), and that it therefore presents a potential that may vary in response to electrostatic conditions to which said portion of the switch is subjected.

The conductor may be arranged inside the enclosure at a predefined distance from a switch element that is subjected to the medium or high voltage when the medium or high voltage is applied to the switch, at least when the first and second contacts are in the closed position.

A dielectric material may be provided between the switch element and the conductor, the material presenting permittivity that is greater than that of a vacuum.

Such a material provides good control over the capacitance, and therefore over the maximum potential difference between the conductor and the switch element. Thus, with such control over the maximum potential difference between the conductor and the switch element, it is possible to monitor accurately the threshold pressure inside the enclosure from which partial discharges are generated.

The switch element is a contact selected from the first and second contacts.

The shield may be made of a conductive material disposed inside the enclosure having potential that is floating and the shield may be the switch element.

The conductor may comprise at least one tapered portion, preferably tapering towards the switch element.

Such a tapered portion makes it possible to define the portion of the conductor via which electric discharges are generated, while obtaining good control over the threshold pressure from which partial discharges are generated.

The invention also provides a medium- or high-voltage vacuum-insulated switch assembly, said assembly comprising a switch of the invention, and an ultra high frequency antenna arranged in such a manner as to enable partial discharges generated inside the enclosure to be detected.

Such an assembly makes it possible to fully make the most of the advantages of a switch of the invention since it is configured to enable partial discharges to be detected by means of an ultra high frequency antenna.

The invention also provides a method of testing a medium- or high-voltage switch of the invention, comprising the steps consisting in:
  connecting the switch to medium or high voltage; and
  detecting any partial discharges, which partial discharges are characteristic of pressure inside the enclosure that is greater than the pressure threshold.

Such a method makes it possible to test a switch of the invention.

The method may include a prior step of providing an ultra high frequency antenna arranged in such a manner as to enable partial discharges generated inside the enclosure to be detected, and the step of detecting the presence of partial discharges is implemented by means of said ultra high frequency antenna.

An alternative solution to that of the invention relates to a medium-voltage or high-voltage switch, comprising:
  a high-vacuum enclosure; and
  first and second contacts that are mounted to be movable in translation relative to each other inside the enclosure between an open position in which the first and second contacts are spaced apart, and a closed position in which the first and second contacts are in electrical contact.

The switch further comprises at least two electrodes disposed inside the enclosure in such a manner as to define a gap, the first electrode being electrically connected to one of the first and second contacts, and the second electrode being connected to a conductor passing through the enclosure in such a manner as to allow a potential difference to be applied between the first and second electrodes.

The potential difference may come from a specific power supply or it may be obtained naturally by capacitive coupling because of the presence of the medium or high voltage on the contact under consideration.

The potential difference between the first and second electrodes may be applied in permanent manner during operation.

The potential difference between the first and second electrodes may be applied from time to time during a specific test.

The use of two electrodes, dedicated to detecting the loss of vacuum inside the vacuum bottle, makes it possible to perform said detection without interrupting the normal operation of the circuit breaker.

Such detection of the loss of vacuum inside the vacuum bottle is based on a potential difference between the first and second electrodes that is small relative to the potential difference that can exist between the first and second contacts of the vacuum bottle when the electric circuit is open. Thus, transient phenomena that may be created between the first and second electrodes have no effect relative to the ability to open the electric circuit at the first and second contacts or regarding the external insulation of the switch.

Thus, with such a switch, loss of vacuum may be detected even while it is in operation. It is therefore not necessary to open the electric circuit in order to detect the loss of vacuum.

The second conductor may pass through the enclosure in hermetically sealed manner.

In another possibility of this alternative to the invention, one of the first and second contacts may form the first electrode, the second electrode being disposed inside the enclosure in response to said contact in such a manner as to define a gap relative to the same contact.

The alternative solution to the invention also provides a device for detecting the loss of vacuum in a switch in accordance with said alternative, said device comprising:
  a switch in accordance with the alternative to the invention;
  means for establishing a potential difference between the first and second electrodes, said potential difference being small relative to the difference existing between the first and second contacts; and
  means for measuring a current between the first and second electrodes.

Below, and in the remainder of the document, "small potential difference relative to the difference existing between the first and second contacts" refers to the fact that the potential difference between the first and second electrodes is less than one tenth of the difference between the first and second contacts when the switch is in the open position.

In a preferred characteristic, the means for establishing a potential difference between the first and second electrodes comprise an external voltage source.

In a preferred alternative characteristic, one of the first and second electrodes is mounted on one of the first and second contacts and the means for establishing a potential difference between the first and second electrodes is capacitive coupling between said one of the first and second electrodes and said one of the first and second contacts.

In a preferred characteristic, the device further comprises a monitoring module in order to manage automatically the detection of any loss of vacuum inside the enclosure.

Thus, the quality of the vacuum is monitored continuously and it is possible to intervene before the vacuum becomes insufficient.

The invention also provides a fabrication method of a switch comprising the following steps:
  defining a pressure threshold,
  providing a conductor,
  providing at least one part of an enclosure intended to form the enclosure of the switch,
  arranging the conductor into the enclosure in such a manner that, when the switch is formed, partial discharges are generated by said conductor when the pressure into the enclosure reaches an pressure threshold, the first and second contacts being in the closed position and the medium or high voltage is applied to said switch.

BRIEF DESCRIPTION OF THE DRAWINGS

The present invention can be better understood on reading the description of embodiments given purely by way of indicative and non-limiting example, and made with reference to the accompanying drawings in which.

Identical, similar, or equivalent portions in the various figures are given the same numerical references in such a manner as to facilitate passing from one figure to another.

The various portions shown in the figures are not necessarily shown to the same scale, in order to make the figures easier to read.

The various possibilities (variants and embodiments) of the invention should be understood as not being mutually exclusive and they may be combined with one another.

DETAILED DESCRIPTION OF PARTICULAR EMBODIMENTS

Figure 1:
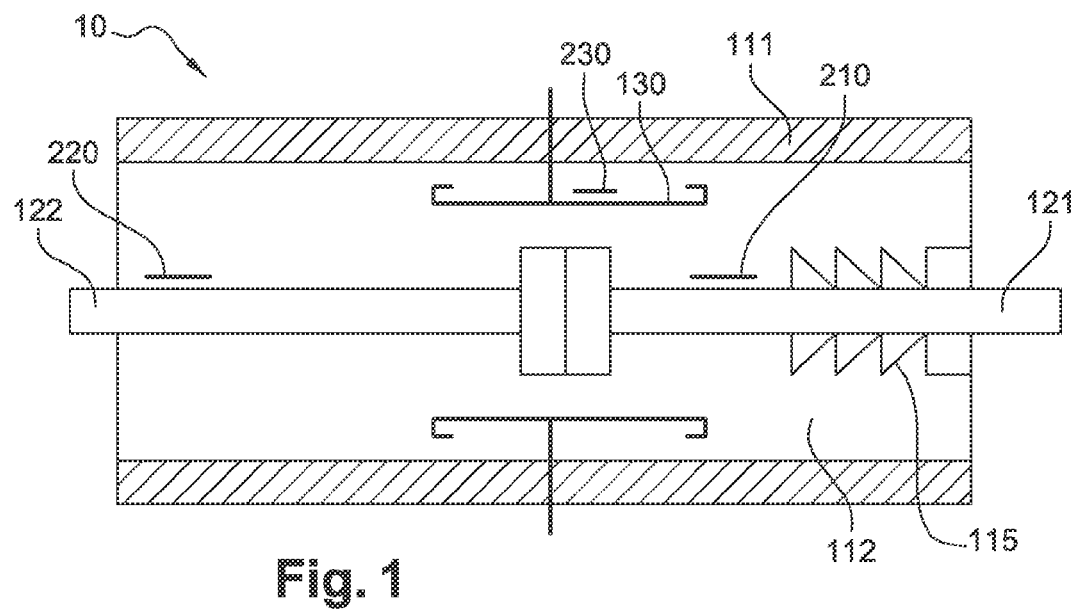
FIG. 1 is a schematic showing a vacuum bottle having three conductors of the invention, and showing three possible positions for a conductor of the invention.

FIG. 1 shows a high-voltage switch 10 of the vacuum-insulated type, such as a vacuum bottle and that thus includes a high-vacuum enclosure. The high-voltage switch shown in FIG. 1 is adapted to allow a pressure test to be made in order to determine whether the pressure inside the enclosure is below a critical pressure.

Such a medium- or high-voltage switch 10, which is a vacuum bottle in FIG. 1, comprises:
  a high-vacuum enclosure 111;
  first and second contacts 121, 122 that are mounted inside the enclosure 111 to be movable in translation relative to each other between an open position in which they are spaced apart, and a closed position in which they are in electrical contact;
  a shield 130 made of a conductive material inside the enclosure 111 and at a floating potential; and
  first, second, and third conductors 210, 220, 230 each arranged inside the enclosure 111 in such a manner that there exists a respective pressure threshold inside the enclosure 111 from which partial discharges are generated by each of said conductors, at least when the first and second contacts are in the closed position and the medium or high voltage is applied to said switch 10.

Conventionally, the enclosure 111 is formed by an enclosure body that is made of insulating material such as a ceramic, it is of cylindrical shape, and it defines a closed and sealed gap 112.

In order to provide dielectric insulation, the pressure in the gap 112 is less than 0.1 Pa and preferably lies in the range $10^{-3}$ Pa to $10^{-5}$ Pa, i.e. in the range $10^{-5}$ mbar to $10^{-7}$ mbar. With such pressure, the enclosure is under high vacuum.

Above, the term "high vacuum" refers to a pressure lying in the range $10^{-3}$ Pa to $10^{-5}$ Pa.

The first and second contacts 121 and 122 are disposed inside the enclosure 111 in such a manner that each has one end projecting out from the enclosure 111 in order to allow the contacts to be connected to a medium- or high-voltage circuit.

The first contact 121 is mounted to be movable in translation inside the enclosure 111, a bellows 115 being provided in order to allow such movement without that damaging the sealing of the enclosure 111. The second contact 122 is mounted so as to be secured to the enclosure 111. The mounting enabling the first contact 121 to be movable in translation is adapted to cause the first contact 121 to move relative to the second contact 122 between an open position in which the first contact 121 is separated from the second contact 122 and a closed position in which the first contact 121 is in contact with the second contact 122.

The shield 130 serves to protect the enclosure 111 against condensation of the metal vapor generated by the arc when passing from the closed position to the open position. The shield 130 is made of a conductive material and it is not connected to any voltage source or voltage reference in such a manner as to leave it at a potential that is floating.

When the switch 10 is installed in a medium- or high-voltage circuit, one of the first and second contacts 121, 122 is connected to the downstream portion of the electric circuit, whereas the other one is connected to the upstream portion of the same electric circuit.

Thus, when the switch 10 is in the closed position, i.e. when the first contact 121 is in the closed position in electrical contact with the second contact 122, and medium or high voltage is applied to said switch 10, the first and second contacts are both subjected to the high voltage. In addition, since the shield 130 is at a floating potential, it is influenced by the same medium or high voltage. As a result, the potential of the shield 130 is equal to a fraction of the voltage applied to the first and second contacts 121, 122, which fraction lies in the range 20% to 70%. The first contact 121, the second contact 122, and the shield 130 are therefore elements of the switch 10 that are subjected to the medium or high voltage when the medium or high voltage is applied to the switch 10, at least when the first and second contacts 121, 122 are in the closed position.

The three conductors 210, 220, 230 show three possible arrangements of a conductor inside the enclosure 111 in order for generating partial discharges when the pressure in the gap 112 defined by the enclosure 111 is greater than a critical pressure and when the switch 10, in the closed position, is connected to medium or high voltage.

Thus, the first conductor 210 is associated with the first contact and is positioned at a distance therefrom in such a manner that partial discharges are generated between the first conductor and said first contact 121 when the switch 10, in the closed position, is connected to medium or high voltage. This arrangement is preferably made along the first contact 121 in such a manner as to maintain a distance between the first conductor 210 and the first contact 121 that is constant whatever the position of the first contact 121.

Figure 2:
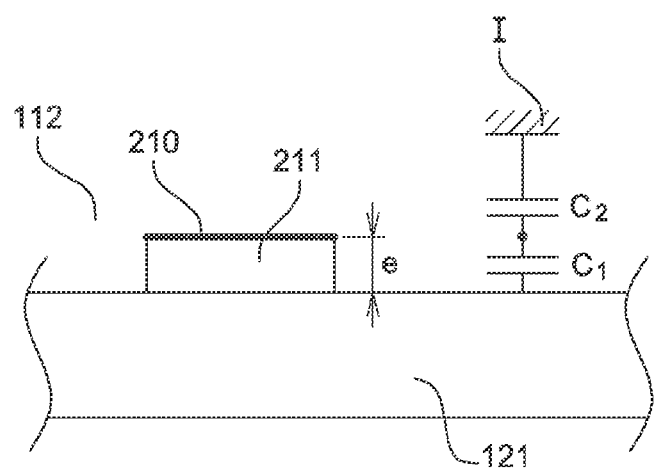
FIG. 2 is a schematic showing a vacuum bottle having a conductor that is insulated from one of the contacts of the vacuum bottle by means of an insulating material.

The principle of the arrangement of the conductor facing the first contact is shown in FIG. 2. The first conductor is disposed at a distance e from the first contact 121, thereby leaving a gap filled with a dielectric material 211, and thus cooperating with the first contact 121 to form a capacitor having capacitance C1, as shown schematically in FIG. 2. The same conductor also cooperates with ground, if any, or with an infinite potential I, to form a capacitor having capacitance C2, also shown schematically in FIG. 2. Thus, the potential V of the first conductor V satisfies the following equation:

$$V = \frac{U \times C_1}{C_1 + C_2} \quad (1)$$

with U being the potential of the first contact 121, C1 and C2 being the capacitances of the capacitors formed by the first conductor 210 respectively in association with the first contact 121 and with ground or potential I. Since the capacitances C1 and C2 do not present significant variation with varying pressure inside the enclosure, it is possible to use a rated AC operating voltage of the switch to determine the maximum potential difference in operation between the first conductor 210 and the first contact 121.

From said maximum potential difference in operation, from the arrangement of the first conductor 210, and from the variation in the breakdown voltage of the vacuum as a function of the pressure inside the enclosure, it is possible to define the threshold pressure from which partial discharges are generated between the first contact 121 and the first conductor 210.

The voltage Vbd, from which a partial discharge is generated, depends on the gap e, the shape of the first conductor 210, and the pressure that exists inside the enclosure. The threshold value inside the enclosure 111, from which the partial discharges are generated, is the pressure value at which the voltage Vbd becomes equal to the maximum potential difference in operation between the conductor 210 and the first contact 121.

Figure 3:
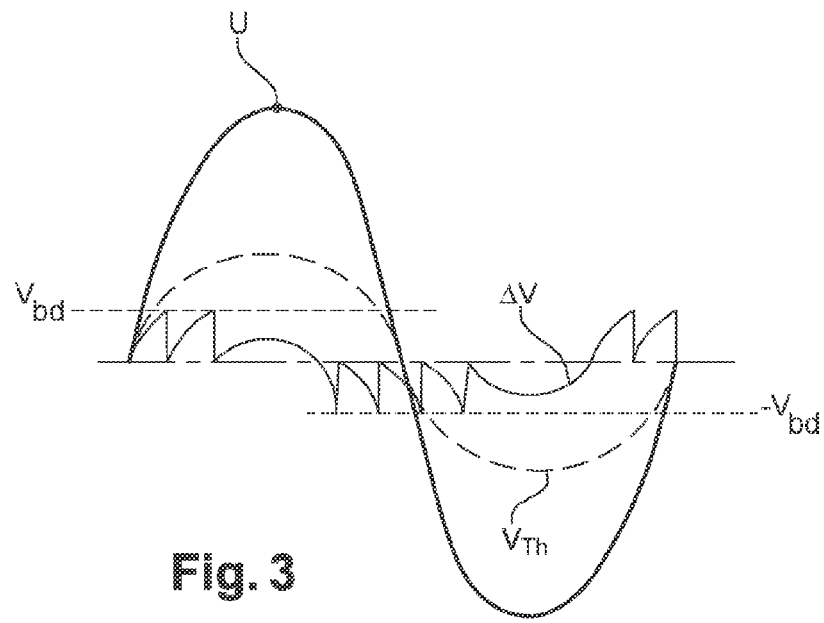
FIG. 3 shows the principle of generating partial discharges by means of a conductor of the invention when the vacuum bottle is connected to high voltage and presents pressure that is greater than the threshold pressure.

FIG. 3 thus shows the principle of partial discharge generation for pressure inside the enclosure 111 that is much greater than the threshold pressure. FIG. 3 shows, over one period, the variation in the AC voltage U applied at the first contact 121 in parallel with the theoretical potential VTh (i.e. in the absence of partial discharge) that is calculated on the basis of equation (1). In this same FIG. 3, the voltage Vbd at which partial discharges appear at the conductor is indicated by two horizontal dashed lines. The voltage curve ΔV represents the potential difference between the first conductor 210 and the first contact 121. Said voltage returns to zero each time the potential difference between the first conductor 210 and the first contact 121 reaches the theoretical threshold Vbd at which discharges appear and at which a partial discharge takes place.

Once the voltage Vdb is reached, a discharge takes place giving rise to transfer of load between the first contact 121 and the first conductor 210, thereby reducing the potential difference ΔV between the potential of the first contact 121 and the potential of the first conductor 210. The voltage applied to the first contact then continues to increase, and leads to another increase in the potential difference ΔV until a new partial discharge is triggered.

In the embodiment shown in FIG. 3, over one period, eight partial discharges are generated.

Figure 4A:
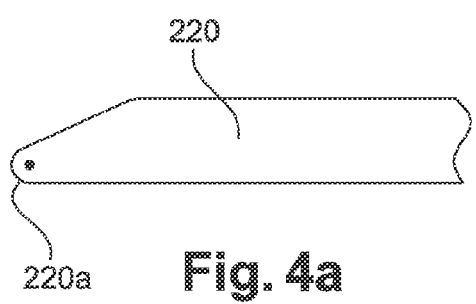
FIGS. 4A and 4b show two examples of possible shapes for a conductor of the invention.
Figure 4B:
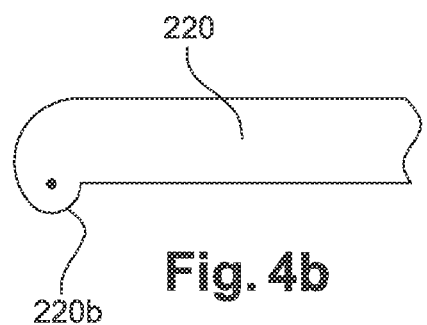

In order to ensure the shape of the partial discharges is well defined and in order to obtain good reproducibility of the threshold pressure from which the partial discharges are triggered, the shape of each of the conductors 210, 220, 230 may be optimized. FIGS. 4a and 4b thus illustrate two examples of an end shape that may be implemented in the invention. Thus, the end 220a, 220b of the conductor may be tapered in such a manner as to increase locally the electric field at said end 220a, 220b and promote partial discharge generation at said end 220a, 220b. The end 220b that is tapered in this way preferably tapers towards the switch element 10 beside which the conductor 210, 220, 230 is spaced apart, as shown in FIG. 4b.

Naturally, it may also be envisaged for one of the conductors 210, 220, 230 to present a tapered portion other than one of its ends. Thus, without going beyond the ambit of the invention and by way of example, one of the conductors 210, 220, 230 may include a tapered portion projecting from the surface of the conductor towards the switch element 10 beside which the same conductor 210, 220, 230 is spaced apart.

It should also be noted that with such an arrangement in which the first conductor 210 inside the enclosure 111 faces the first contact 121 (if it is the first contact 121 that is connected to the power supply circuit), there is no need for the switch 10 to be in the open position in order to be able to test the pressure inside the enclosure 111.

In this configuration, when the medium or high voltage is applied to the switch 10 by means of the power supply circuit, said voltage is applied at the first contact 121 whatever the position of the switch 10. The conductor thus also presents its potential that varies in accordance with equation 1, whatever the position of the switch 10.

As shown in FIG. 1, as an alternative to or in addition to positioning the first conductor as explained above, the switch 10 may also include a second conductor 220 spaced apart from the second contact 122. The principle of partial discharge generation when the pressure inside the enclosure 111 is greater than or equal to the threshold pressure is identical to the principle explained for the first conductor 210.

In addition, and as shown in FIG. 1, as an alternative to the first and/or second conductor 210, 220, or in addition thereto, the switch 10 may also include a third conductor 230 spaced apart from the shield 130. The principle of partial discharge generation by such a third conductor 230 remains identical to that described for the first conductor 210.

Thus, whatever the configuration of the switch 10, with either the first conductor 210 or the second conductor 220 or the third conductor 230 or any other combination of these three conductors, it is possible to perform a test for testing the quality of the vacuum without having to place the switch 10 in the open position.

As shown above, when the medium or high voltage is applied to the switch 10 and the pressure inside the enclosure 111 is greater than the critical pressure threshold, the first, second, and third conductors 210, 220, 230 present an arrangement that is adapted to generating partial discharges. Thus, it is possible to determine whether or not the pressure inside the enclosure is greater that the threshold pressure simply by detecting partial discharges generated by the conductor(s) 210, 220, 230 of the switch 10.

Such detection may be implemented by means of a method comprising the following steps:
 providing an ultra high frequency antenna that is arranged in such a manner as to allow partial discharges generated inside the enclosure 111 to be detected;
 previously connecting the switch 10 at medium or high voltage; and
 detecting any partial discharges, which partial discharges are characteristic of pressure inside the enclosure that is greater than the pressure threshold.

In order to enable such a method of testing the pressure inside the enclosure 111 of the switch 10 to be implemented easily, the switch 10 may be included in an assembly having an ultra high frequency antenna 31, 32.

Figure 5A:
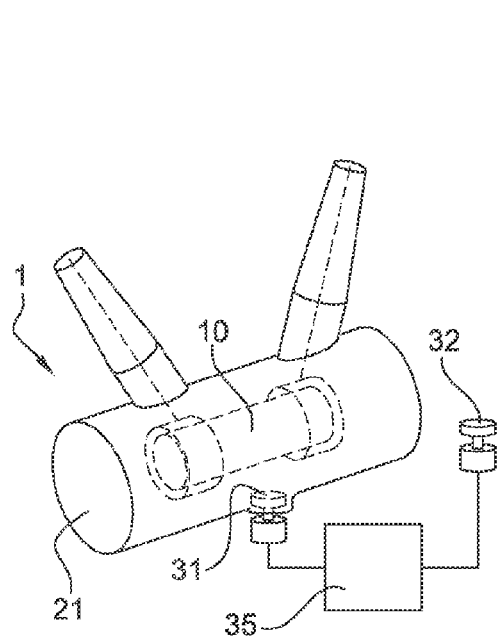
FIGS. 5a and 5b show two examples of switch assemblies comprising a switch as shown in FIG. 1 and at least one ultra high frequency (UHF) antenna that allows partial discharges generated by the conductor to be detected.
Figure 5B:
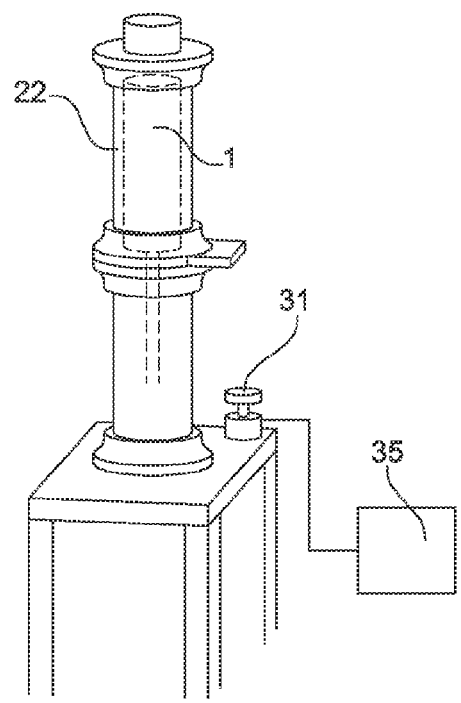

FIGS. 5a and 5b show two examples of such an assembly 1, each corresponding to a respective configuration of the switch 10.

Thus, the first example of an assembly 1 corresponds to a configuration in which the switch 10 is disposed in a metal enclosure 21 that is grounded. In this configuration, in order to ensure correct detection of the partial discharges, it is preferable for the assembly 1 to include a first ultra high frequency antenna 31 disposed in the same metal tank 21. A second ultra high frequency antenna 32 may further be provided in order to make it possible to distinguish between the electromagnetic signature of the partial discharges generated inside the enclosure 111 and surrounding noise. This assembly may include a processor unit 35 that is adapted to process the electromagnetic signals received by the first ultra high frequency antenna 31 and to detect a partial discharge as generated inside the enclosure 111.

The second example of an assembly corresponds to a configuration in which the switch 10 is disposed in an insulating tank, e.g. made of ceramic. In this second configuration, the ultra high frequency antenna 31 may be disposed outside the insulating tank 22. In a manner similar to the first example given above, the assembly in this second example may include a processor unit 35 that is adapted to process the electromagnetic signals received by the first ultra high frequency antenna 31 and to detect a partial discharge as generated inside the enclosure 111.

Figure 6:
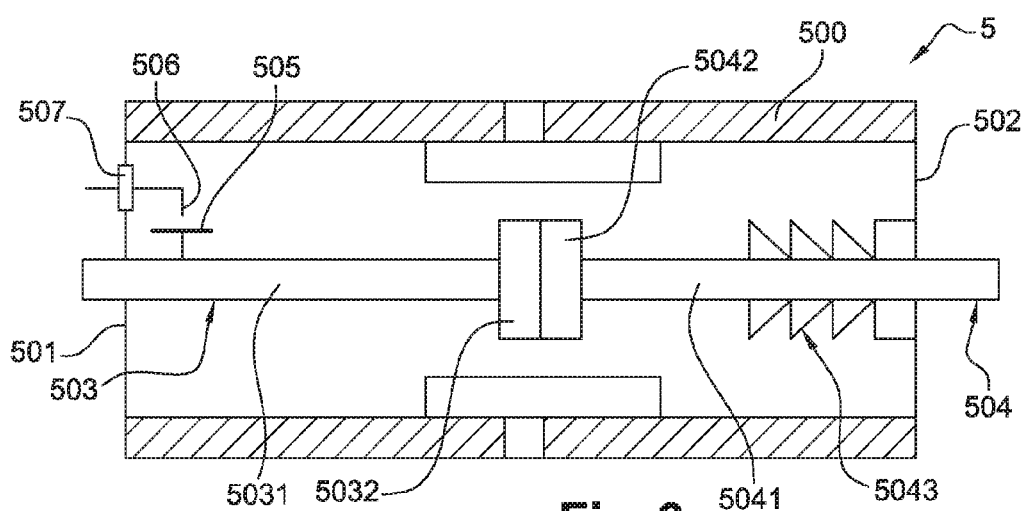
FIG. 6 shows a vacuum bottle provided with two electrodes in order to enable the vacuum to be measured in an alternative to the invention.
Figure 7:
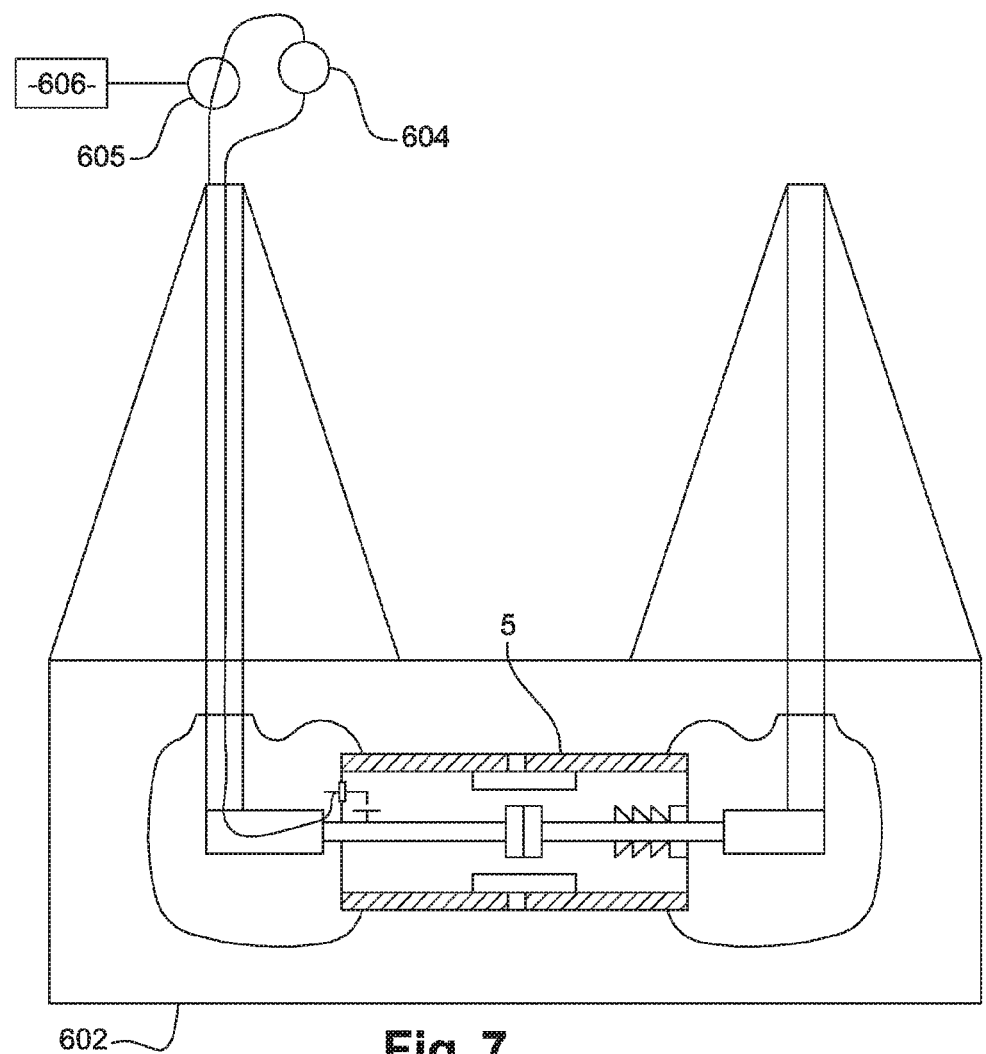
FIG. 7 is a schematic showing a circuit breaker fitted with a vacuum bottle as shown in FIG. 6.

FIGS. 6 and 7 show an alternative solution to the invention.

FIG. 6 thus shows a vacuum bottle 5 of said alternative solution. This vacuum bottle 5 comprises a ceramic enclosure of substantially cylindrical shape 500 that provides external insulation of the vacuum bottle. The two ends of the enclosure 500 are closed by two metal end covers 501 and 502.

It should be observed that only the elements of the vacuum bottle that are useful in understanding this alternative to the invention are described below.

A first contact 503 that is stationary relative to the enclosure is disposed inside the enclosure 500. The first contact 503 comprises a rod 5031 having one end provided with a contact zone 5032.

A second contact 504 is disposed inside the enclosure 500. The second contact 504 comprises a rod 5041, one end of which is provided with a contact zone 5042. The first and second contacts 503, 504 are contacts that perform the function of interrupting current.

The axes of the rods 5031 and 5041 substantially coincide with the axis of the cylindrical enclosure 500, and the contact zones 5032 and 5042 face each other in a central zone of the enclosure 500.

The second contact 504 is movable relative to the enclosure. More precisely, a metal bellows 5043 makes it possible to move the rod 5041 in translation relative to the enclosure 500. This movement moves the contact zone 5042 closer to or further away from the contact zone 5032 in such a manner as to close the electric circuit or on the contrary to open it.

The rods 5031 and 5041 pass through the covers 501 and 502 respectively. Mechanical supports (not shown) are conventionally provided for holding the various elements together.

In this alternative to the invention, first and second electrodes 505 and 506 are provided inside the vacuum bottle 5.

The first electrode 505 is secured to the stationary rod 5031. The second electrode 506 is connected to a conductor passing through the cover 501, via a leaktight insulator of a partition bushing 507.

The first and second electrodes 505 and 506 are disposed relative to one another in such a manner as to define a gap between them.

Preferably, the first and second electrodes 505 and 506 are placed so as not to influence the electric arc extinction zone between the contact zones 5032 and 5042. Furthermore, the first and second electrodes 505 and 506 are thus less exposed to possible projections of molten metal generated at the contact zones 5032 and 5042 of the first and second contacts 503 and 504.

In a non-preferred variant, the first and second electrodes 505 and 506 are placed beside the movable main electrode 504. In this event, the electrode 505 is secured to the movable rod 5041.

FIG. 7 shows a circuit breaker assembly 602 fitted with the above-described vacuum bottle 5. It is an assembly in a configuration in which the switch 10 is disposed in a metal enclosure 21 that is grounded.

It should be observed that only the elements of the circuit-breaker assembly 602 that are useful to understanding this alternative to the invention are described below.

The ends of the rods 5031 and 5041 exiting the vacuum bottle via the shields 501 and 502 are connected respectively to the upstream and downstream portions of the electric circuit (not shown).

In an example of voltages applied at the terminals 505 and 506, a voltage generator 604 may be connected between the first and second electrodes 505 and 506, in such a manner as to be capable of generating a potential difference between these electrodes. This potential difference is small relative to that which may exist between the first and second contacts. By way of example, it may be of a few kilovolts. Thus, the insulator 507, which insulates the shield 501 and the rod 5031 from the additional electrode 506, must comply with insulation requirements that remain limited.

For the same reason, the connection wire connected to the additional electrode 506 may have limited insulation relative to the high voltage potential and it can pass inside the busbar bushing in order to exit at the top of the bushing, as shown in FIG. 7.

In a variant embodiment of this alternative to the invention, the voltage generator 604 is replaced by a circuit that recovers a portion of the voltage of the first contact 503 on which the first electrode 505 is mounted. By way of example, this circuit is a capacitive coupling. Thus, the device does not need an external voltage source. This variant of the alternative to the invention may be preferred for permanently monitoring the state of the vacuum within the switch while the switch is in operation.

An ammeter 605 is connected between the first and second electrodes 505 and 506, in such a manner as to measure the current of the electric discharges. In a variant, the ammeter is replaced by a discharge counter.

The discharge current depends on the quality of the vacuum inside the vacuum bottle.

By way of example, the discharge current is measured at regular intervals, and that makes it possible to define how the quality of the vacuum inside the vacuum bottle 5 varies over time.

In another possibility of this alternative to the invention, a monitoring module 606 automatically checks the quality of the vacuum inside the vacuum bottle 5. The monitoring module 606 automatically manages detection of loss of vacuum inside the vacuum bottle. To do this, leakage or discharge current is measured regularly and the results are stored. These measurements are taken without interrupting the normal operation of the circuit-breaker assembly.

The quality of the vacuum is thus monitored continuously and it is possible to intervene before the vacuum becomes insufficient, since progressive drift can be detected, and a decision can be taken accordingly. By way of example, it is possible to actuate the circuit breaker or to decide about a maintenance operation or to replace the vacuum circuit breaker. An alarm threshold may be provided to indicate that the vacuum has become insufficient for correct operation of the circuit breaker.

It may be noted that in the context of this alternative to the invention, it is possible to omit the first electrode 505 by placing the second electrode 506 at a distance from either of the rods 5031 and 5043 in such a manner as to define a gap, said rod thus forming said first electrode. Apart from this difference, such an arrangement operates on the same principle of said alternative to the invention.

What is claimed is:

1. A medium-voltage or high-voltage switch, comprising:
a high-vacuum enclosure;
a first contact and a second contact that are mounted to be movable in translation relative to each other inside the enclosure between an open position in which the first contact and the second contact are spaced apart, and a closed position in which the first contact and the second contact are in electrical contact;
a shield made of a conductive material disposed inside the enclosure having a potential that is floating,
a conductor distinct from the shield, the first contact and the second contact, the conductor being at a floating potential and the conductor being arranged inside the enclosure at a predefined distance from a switch element comprising one of the first contact, the second contact and the shield, the predefined distance being defined in such a manner that there exists a pressure threshold inside the enclosure from which partial discharges are generated by said conductor, at least when the first and second contacts are in the closed position and the medium or high voltage is applied to said switch.

2. The medium- or high-voltage switch according to claim 1, wherein a dielectric material is provided between the switch element and the conductor, the dielectric material presenting permittivity that is greater than that of a vacuum.

3. The medium- or high-voltage switch according to claim 1, wherein the switch element is one of the first contact and the second contact.

4. The medium- or high-voltage switch according to claim 1, wherein the switch element is the shield.

5. A medium- or high-voltage vacuum-insulated switch assembly, the assembly comprising the medium- or high-voltage switch according to claim 1, and an ultra high frequency antenna arranged in such a manner as to enable partial discharges generated inside the enclosure to be detected.

6. A method of testing the medium- or high-voltage switch according to claim 1, comprising the steps consisting in:
connecting the medium- or high-voltage switch to a medium or high voltage; and
detecting any partial discharges, which partial discharges are characteristic of pressure inside the enclosure that is greater than the pressure threshold.

7. The test method according to claim 6, including a prior step of providing an ultra high frequency antenna arranged in such a manner as to enable partial discharges generated inside the enclosure to be detected, and wherein the step of detecting any partial discharges is implemented by means of said ultra high frequency antenna.

8. A medium-voltage or high-voltage switch, comprising:
a high-vacuum enclosure;
a first contact and a second contact that are mounted to be movable in translation relative to each other inside the enclosure between an open position in which the first contact and the second contact are spaced apart, and a closed position in which the first contact and the second contact are in electrical contact;
a conductor arranged inside the enclosure in such a manner that there exists a pressure threshold inside the enclosure from which partial discharges are generated by said conductor, at least when the first and second contacts are in the closed position and the medium or high voltage is applied to said switch,
wherein the conductor comprises at least one tapered portion.

9. The switch according to claim 8, wherein the tapered portion tapers towards the switch element.

10. A medium-voltage or high-voltage switch, comprising:
a high-vacuum enclosure;
a first contact and a second contact that are mounted to be movable in translation relative to each other inside the enclosure between an open position in which the first contact and the second contact are spaced apart, and a closed position in which the first contact and the second contact are in electrical contact;
a shield made of a conductive material disposed inside the enclosure having a potential that is floating,
a conductor distinct from the shield, the first contact and the second contact, the conductor being at a floating potential and the conductor being arranged inside the enclosure at a predefined distance from a switch element comprising one of the first contact, the second contact and the shield, the predefined distance being defined in such a manner that there exists a pressure threshold inside the enclosure from which partial discharges are generated by said conductor, at least when the first and second contacts are in the closed position and the medium or high voltage is applied to said switch, wherein the conductor comprises at least one tapered portion.

* * * * *